United States Patent
Hashimura

(10) Patent No.: US 7,696,843 B2
(45) Date of Patent: Apr. 13, 2010

(54) MEMS FILTER DEVICE HAVING A NANOSIZE COUPLING ELEMENT AND MANUFACTURING METHOD THEREOF

(75) Inventor: Akinori Hashimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 376 days.

(21) Appl. No.: 11/570,924

(22) PCT Filed: Jul. 25, 2005

(86) PCT No.: PCT/JP2005/013582
§ 371 (c)(1),
(2), (4) Date: Dec. 19, 2006

(87) PCT Pub. No.: WO2006/011449
PCT Pub. Date: Feb. 2, 2006

(65) Prior Publication Data
US 2008/0284544 A1    Nov. 20, 2008

(30) Foreign Application Priority Data
Jul. 27, 2004    (JP) ............................. 2004-218798

(51) Int. Cl.
*H03H 9/50* (2006.01)
*H03H 9/05* (2006.01)

(52) U.S. Cl. ................. 333/186; 333/197; 333/199; 977/742; 977/762; 977/766

(58) Field of Classification Search ................. 333/186, 333/197, 199; 977/742, 762, 766
See application file for complete search history.

(56) References Cited

U.S. PATENT DOCUMENTS

| 6,628,177 B2 | 9/2003 | Clark et al. |
| 6,737,939 B2 * | 5/2004 | Hoppe et al. ................ 333/186 |
| 6,803,840 B2 * | 10/2004 | Hunt et al. .................. 333/186 |
| 2002/0046953 A1 | 4/2002 | Lee et al. |

FOREIGN PATENT DOCUMENTS

| JP | 2002-134325 | 5/2002 |
| JP | 2004-163373 | 6/2004 |
| JP | 2004-193202 | * 7/2004 |

OTHER PUBLICATIONS

Demirci et al.; "Mechanically Corner-Coupled Square Microresonator Array For Reduced Series Motional Resistance"; Digest of Tech. Papers, the 12th International Conference on Solid State Sensors & Actuators (Transducers'03); Boston, MA, Jun. 8-12, 2003, pp. 955-958.*

(Continued)

*Primary Examiner*—Barbara Summons
(74) *Attorney, Agent, or Firm*—Pearne & Gordon LLP

(57) ABSTRACT

An object of the invention is to provide a coupling element of an MEMS filter with design flexibility and minimization of mass loading effects. The invention provides a structure wherein the mass loading effects are not reflected on the MEMS filter characteristic by using a nanosize coupling element with a very small mass compared to a microsize MEMS resonator, such as a carbon nanotube (CNT), as a coupling element part.

9 Claims, 13 Drawing Sheets

OTHER PUBLICATIONS

Williams et al.; "Torsional Response and Stiffening of Individual Multiwalled Carbon Nanotubes"; Physical Review Letters, The American Physical Society, vol. 89, No. 25, Dec. 16, 2002, pp. 255502-1 through 255502-4.*

Wang et al., "High-Order Medium Frequency Micromechanical Electronic Filters", IEEE Journal of Microelectromechanical Systems, vol. 8, No. 4, Dec. 1999, pp. 534-557.

Bannon, III et al., "High-Q HF Microelectromechanical Filters", IEEE Journal of Solid-State Circuits, vol. 35, No. 4, Apr. 2000, pp. 512-526.

International Search Report

* cited by examiner

MEMS FILTER DEVICE HAVING A NANOSIZE COUPLING ELEMENT AND MANUFACTURING METHOD THEREOF

TECHNICAL FIELD

This invention relates to an MEMS filter unit and its manufacturing method and in particular to the coupling element of an MEMS filter formed using an MEMS (Micro Electro Mechanical Systems) technology and a nanotube, nanowire technology.

BACKGROUND ART

Silicon (monocrystalline, polycrystalline, amorphous silicon) can be named as material mainly used in the MEMS filter. The silicon is widely used not only for its compatibility to the IC process, but also for its superior mechanical and electrical characteristics, and various methods are proposed for filter excitation and detection methods. Among a large number of methods, a filter using capacitance type resonators can be manufactured comparatively easily using silicon micromachining process, and therefore well suited for realization of the GHz-band MEMS filter.

Mainly, the current capacitance type MEMS filter has a structure wherein a large number of MEMS resonators are joined mechanically by a microsize beam, etc., and the center frequency of the filter is determined by the resonating frequency of the constituent MEMS resonators. When a certain number of MEMS resonators are connected, the number of frequency mode peaks that appears are equivalent to the number of the MEMS resonators connected, each with distinct mode shape that are different in phase. The frequency bandwidth of the MEMS filter is determined by a spring constant $k_{cij}$ of a coupling element for joining the resonators and a spring constant $k_{rc}$, which is the connecting part of the MEMS resonator and the coupling element.

Non-patent document 1 shows an example of a capacitance type MEMS filter, wherein a structure of joining two polycrystalline silicon doubly-clamped beam MEMS resonators is used. The results of Q value 40 to 450, frequency bandwidth 0.2% to 2.5%, insertion loss 2 dB or less with the center frequency of the filter as 8 MHz are achieved. The design specifications of the MEMS resonator are 40.8 µm in length, 8 µm in width, and 1.2 µm in thickness and the coupling beam is formed with the dimensions of 20.35 µm in length, 0.75 µm in width, and 1.2 µm in thickness comparatively close to those of the resonator. If the MEMS resonator and the beam as the coupling element for joining the MEMS resonators are formed with equivalent microsize dimensions and a length coupling element as less than one-eighth wavelength λ as in non-patent document 1, the mass of the coupling element is added to the mass of the MEMS resonator and the shifting of center frequency of the filter may result. Such mass loading effects are reflected on the filter characteristic, so that any desired passband waveform may not be obtained.

Non-patent document 2 illustrates an example of joining three MEMS resonators mechanically, and this case is shown as a block diagram of FIG. 28. A first MEMS resonator 10, a second MEMS resonator 12, and a third MEMS resonator 14 are contained and a first coupling beam 16 and a second coupling beam 18 for connecting them are further contained. FIG. 29 shows an electric equivalent circuit to FIG. 28 and corresponds to the case where the first and second coupling beams 16 and 18 are formed as a length of λ/8 or less. Numerals 20, 22, and 24 denote the first to third MEMS resonators 10, 12, and 14, and numerals 26 and 28 denote the first and second coupling beams 16 and 18. In FIG. 29, the mass of the first coupling beam 16 is indicated by inductor L26a, 26b, the mass of the second coupling beam 18 is indicated by inductor L28a, 28b, and the value of each L becomes equal to a half of the static mass of the coupling beam.

As shown in expression 3, $Z_L$ represents the impedance of the inductor L, w represents the resonating frequency, and $M_1$ represents the static mass of the coupling beam. Spring constants 26c and 28c of the coupling beams are represented each by the reciprocal of a capacitor C. When this is shown in expression 4, $Z_C$ represents the impedance of the capacitor C and $k_1$ represents a static spring constant of the coupling beam.

$$Z_L = jwL = jw(M_1/2); \quad w = 2\pi f \qquad \text{[Expression 3]}$$

$$Z_C = 1/jwC = k_1/jw; \quad w = 2\pi f \qquad \text{[Expression 4]}$$

FIG. 30 shows an example of the passband waveform of the three-stage MEMS filter. If the mass of the coupling beams can be ignored, the passband waveform should represent a waveform close to an ideal waveform 30; however, the mass of second MEMS resonator 12 is increased due to the mass effect of the first and second coupling element beams 16 and 18 joining to the left and the right of the resonator 12 as compared with the first MEMS resonator and the third MEMS resonator, leading to the result having a distorted waveform 32, etc. From such a problem, the author of non-patent document 2 proposes the following two methods:

In one of the methods, the coupling element is designed as a length of λ/4, whereby 26a, 26b of the coupling element 26 shown in the equivalent circuit in FIG. 29 is replaced with a minus value of the capacitor C of 26c. Accordingly, the mass of the coupling beam does not appear in the characteristic of the MEMS filter. In another method, the design of connecting the coupling element and the MEMS resonator is proposed. The coupling beam is joined at the coupling node of the MEMS resonator where the vibration amplitude at the resonance is small, whereby large values of MEMS resonator mass $m_{rc}$ and spring constant $k_{rc}$ are obtained at the connection part of the MEMS resonator capered to the mass $m_{cij}$ and the spring constant $k_{cij}$ of the coupling beam, and as a result the mass loading effects can be minimized in this method.

Patent document 1 has a structure containing a radial contour mode disk type MEMS resonator with a resonating frequency of to 1 GHz. In the radial contour mode, the disk vibrate symmetrically and radial along the perimeter with the center of the disk as a node, and electrode is provided in the surrounding of the disk. Vibration is produced by an electrostatic force, and the vibration capacitor change ratio is detected. The disk type resonator can also be applied to the MEMS filter and coupling element having a beam or a U shape are provided.

Non-patent document 1: Frank Bannon III, John R. Clark, C. T.-C. Nguyen, "High-Q HF Micromechanical Filters," IEEE Journal of Solid-State Circuits, vol. 35, no. 4, 2000

Non-patent document 2: Ku Wang, C. T.-C. Nguyen, "Higher Order Medium Frequency Micromechanical Electronic Filters," Journal of Microelectromechanical Systems, vol. 8, no. 4, 1999

Patent document 1: U.S. Pat. No. 6,628,177

DISCLOSURE OF THE INVENTION

PROBLEMS TO BE SOLVED BY THE INVENTION

In the structure of the MEMS filter using the polycrystalline silicon coupling beams described above, the resonators and the coupling beams making up the filter are of the same microsizes and thus the mass loading effects are reflected on the filter characteristic. To design an MEMS filter at a higher frequency in the future, it is assumable that the structure dimensions of an MEMS resonator will become smaller, and it is predicted that the mass loading effects produced from the coupling beam in the structure in the related art will increase further. To solve this problem, two methods (refer to non-patent document 2) are proposed, but to use the MEMS filters as high-frequency filters, a problem still remains.

In the method of using the coupling element having the length λ/4 described above, it is possible that the design value length cannot be obtained because of the effect of a process error caused by the work limit of manufacturing a coupling beam. In the method, the coupling beam length is fixed to one value on the design and therefore to change the spring constant, it depends only on the width of a coupling element. On the other hand, the width depends on the limitation of top down technology used in the conventional IC manufacturing process and thus it will become difficult to manufacture a nano-order width required for a high-frequency filter in the future.

For the second method, the technique of placing the coupling element at the coupling node of the resonator is used; however, strict restriction is imposed on the resonance structure and the coupling element placement complicates the design. Furthermore, when the coupling element is placed in the vicinity of the coupling node of the resonator, the spring constant $k_{rc}$ of the connection part of the MEMS resonator is fixed to some extent, so the desired MEMS filter Q value or frequency bandwidth is determined only by the spring constant $k_{cij}$ of the coupling element. The spring constant $k_{cij}$ depends on the shape dimensions of the coupling element and thus it affects the flexibility of design.

Patent document 1 proposes the structure containing a radial contour mode disk type MEMS resonator with a resonating frequency up to 1 GHz. The radial contour mode provides the disk vibrating symmetrically and radial along the perimeter with the center of the disk as a node. For optimal coupling, the coupling element needs to be joined from the vicinity of the coupling node to increase the spring constant $k_{rc}$ of the MEMS resonator corresponding to the connection part of the MEMS resonator and the coupling element. However, to couple the MEMS resonator shown in patent document 1 as an MEMS filter, it becomes difficult to connect the coupling element from the center of the disk type MEMS resonator with a coupling beam manufactured from a conventional photolithography process. Moreover, to vibrate in a primary radial contour mode with high Q value, the radius of each disk type MEMS resonator is reduced to 2.76 μm and consequently, the mass loading effects will exacerbate if the equivalent microsize coupling elements are used for connection.

It is therefore an object of the invention to provide a coupling element of an MEMS filter wherein design is flexible and the mass loading effects can be minimized.

Means for Solving the Problems

To accomplish the objective, the invention proposes a structure wherein the mass loading effects are not reflected on the MEMS filter characteristic by using a nanosize coupling element, such as a carbon nanotube (CNT), with a sufficiently small mass as compared with a microsize MEMS resonator. Using the mass of typical aforementioned resonator as a reference, it is desirable that the coupling element should have a sufficiently smaller mass compared to an MEMS resonator, which is in the order of $1 \times 10^{-15}$ kg or less.

In this invention, a nanosize coupling element, such as carbon nanotube, is manufactured using a bottom up technology of self-assembly of material without relying on a limitation of conventional top down technology. Using the bottom up technology, the flexibility of filter design is improved.

The invention provides a method of using CNT or a nanosize coupling element having an equivalent size of CNT as a coupling element of MEMS filter and mechanically coupling them. Although the current CNT manufacturing technology is widely known, two joining methods are proposed for realization of MEMS filters.

In a first aspect of the invention, CNT as a coupling element and MEMS resonators are manufactured in an integrated process. After a manufacturing step of MEMS resonator, CNT is grown between two or more MEMS resonators at a desirable position according to the design and joined at the next step.

In a second aspect of the invention, CNT as a coupling element and MEMS resonators are manufactured separately and connected in the last step. For example, separately manufactured CNT is moved individually to the desirable position of the MEMS resonator according to the design and joined at the next step.

This MEMS filter unit of the invention is characterized by the fact that it includes a plurality of electromechanical resonators each having a resonating body formed so as to be able to mechanically vibrate and an electrode disposed with a predetermined spacing from the resonating body for making possible electromechanical conversion, the electromechanical resonators being joined through a coupling element, wherein the coupling element is a nanosize striped body.

According to the configuration, it is made possible to decrease the mass loading effects and provide a filter unit with better mechanical and electrical characteristics.

The MEMS filter unit of the invention includes an MEMS filter wherein the coupling element is a carbon nanotube (CNT).

According to the configuration, an extremely fine structure can be formed with a great accuracy by self-assembly.

The MEMS filter unit of the invention includes an MEMS filter wherein the coupling element is a nanowire.

According to the configuration, an extremely fine structure can be formed with a great accuracy by self-assembly.

The MEMS filter unit of the invention includes an MEMS filter wherein the resonating body forms a quadrilateral MEMS resonator having at least one coupling node and includes at least one support mechanism so that it is supported on a substrate.

According to the configuration, the structure is stable and since the resonating body is anchored to the substrate from the bottom, plus the connection of the coupling element to the coupling node is easily realized.

The MEMS filter unit of the invention includes an MEMS filter wherein the coupling element is made up of a plurality of lines.

According to this configuration, stronger coupling is made possible.

The MEMS filter unit of the invention includes an MEMS filter wherein the coupling element is formed so as to connect a plurality of parts of the resonating body.

According to the configuration, coupling element can be strengthened. If the coupling element is formed on the top and the bottom of the resonating body, an increase in the spring constant is made possible.

The MEMS filter unit of the invention includes an MEMS filter wherein the coupling element is a coil-shaped body.

According to the configuration, an increase in the spring constant is made possible and design can be provided with flexibility.

The MEMS filter unit of the invention includes an MEMS filter wherein the support mechanism is formed of a carbon nanotube.

According to this configuration, not only can vibration be provided with flexibility, but also degradation of the Q value caused by acoustic loss escaping from a support mechanism to a substrate can be decreased.

The MEMS filter unit of the invention includes an MEMS filter wherein the coupling element is joined at the coupling node of the resonating body.

According to the configuration, the mass loading effects can be further decreased.

A manufacturing method of an MEMS filter unit of the invention is characterized by the process steps of placing electromechanical resonators each having at least two resonating bodies formed so as to be able to mechanically vibrate; an electrode disposed with a predetermined spacing from each of the resonating bodies for making possible electromechanical conversion on a substrate so that the electromechanical resonators are brought close to each other; and forming a coupling element to connect the resonating bodies by a nano-size striped body according to a bottom up technology.

According to the method, a highly accurate MEMS filter unit with small mass loading effects can be provided in extremely simple configuration.

The manufacturing method of the MEMS filter unit of the invention includes an MEMS filter manufacturing method wherein the step of forming the coupling element includes a step of forming a catalyst at a predetermined position of the resonating body and growing the coupling element from the catalyst.

According to the configuration, the catalyst is formed at the predetermined position and therefore the coupling element can be formed with extremely good accuracy.

The manufacturing method of the MEMS filter unit of the invention includes an MEMS filter manufacturing method wherein the step of forming the coupling element includes a step of moving the coupling element at a predetermined position of the resonating body and placing it.

According to this configuration, it is made possible to adjust the coupling element position and accomplish more highly accurate positioning.

The manufacturing method of the MEMS filter unit of the invention includes an MEMS filter manufacturing method wherein the step of forming the coupling element includes a step of forming a carbon nanotube.

The manufacturing method of the MEMS filter unit of the invention includes an MEMS filter manufacturing method, including a step of forming a carbon nanowire.

According to the configuration, an extremely fine structure can be formed with accuracy by self-assembly.

The manufacturing method of the MEMS filter unit of the invention includes an MEMS filter manufacturing method wherein the step of forming the coupling element includes a step of applying a negative DC voltage to a first MEMS resonator and applying a positive DC voltage to a second MEMS resonator provided adjacent to the first MEMS resonator, thereby growing a carbon nanotube or a carbon nanowire.

According to the configuration, the coupling element can be grown efficiently and the MEMS resonators are joined and placed and positive and negative voltages are applied alternately, whereby a large number of coupling elements can be formed efficiently at the same time. A large number of pieces may be previously joined at the same time and may be cut and separated appropriately after growth.

The manufacturing method of the MEMS filter unit of the invention includes an MEMS filter manufacturing method wherein the step of forming the coupling element includes a step of placing the coupling element at a position corresponding to a coupling node of the resonating body.

According to the configuration, it is made possible to form a structure for enabling easy positioning and a further decrease in the mass loading effects.

The manufacturing method of the MEMS filter unit of the invention includes an MEMS filter manufacturing method wherein the step of forming the coupling element includes a step of placing the coupling element in any desired area of the resonating body using a probe of an atomic force microscope (AFM); and a step of moving and placing an electric conductive particle to and at any desired area of the resonating body using a pulse generation by a probe of a scanning tunneling microscope (STM) before joining the coupling element.

According to this method, more highly accurate positioning is made possible.

The manufacturing method of the MEMS filter unit in the invention includes an MEMS filter manufacturing method wherein the step of forming the coupling element is executed before a sacrifice layer removal step and consequently the release of the resonating body from the substrate.

From this configuration, the information of the resonating body is performed, whereby stronger coupling is made possible.

Advantages Of The Invention

According to the MEMS filter of the configuration, nano-size CNT, etc., that can be manufactured easily and at a lower cost is used as the mechanical coupling element of MEMS resonators, whereby a structure wherein the mass loading effects are not reflected on the MEMS filter characteristic. By implementing the CNT as a coupling element, the flexibility in design of filter Q value and the frequency bandwidth of the MEMS filter are realized.

Figure 1:
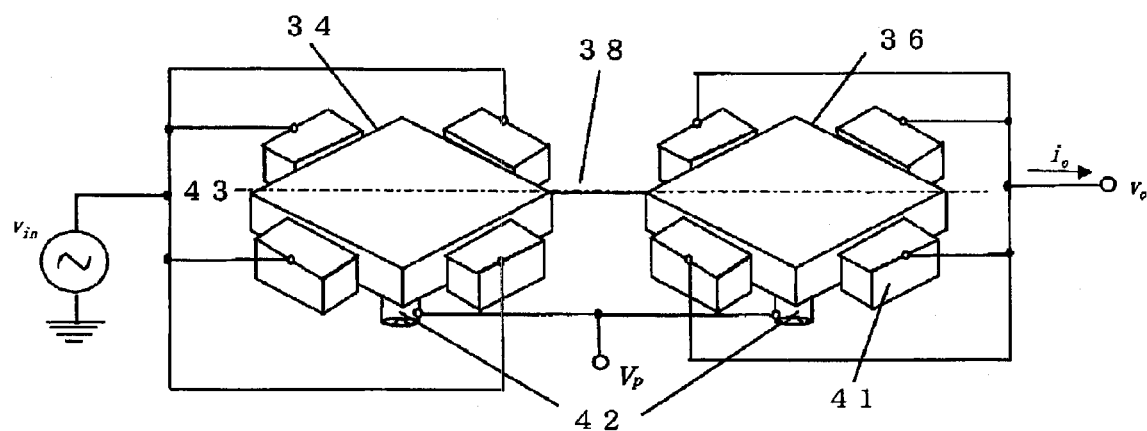
[FIG. 1] A drawing to show an MEMS filter unit in a first embodiment of the invention.

DESCRIPTION OF REFERENCE NUMERALS 10, 12, 14 First, second, third MEMS resonator
16, 18 First, second coupling beam
20 Equivalent circuit to first MEMS resonator
22 Equivalent circuit to second MEMS resonator
24 Equivalent circuit to third MEMS resonator
26, 28 First, second coupling beam equivalent circuit
30 Ideal waveform
32 Distorted waveform
34, 36 First, second MEMS resonator
38, 40, 48 First, second, third coupling element
41 Fixed electrode
42 Post
43 Dashed line
44, 46 Third, fourth MEMS resonator
50 Dashed line
52, 54 Minus, plus electric wiring
56 Bias DC voltage
58 Catalyst
70, 72 First, second MEMS resonator
74, 76 First, second coupling element
78 AFM probe
80 STM probe
82, 88 First, second electric conductor particle
86 DC pulse voltage
90 Silicon layer (base layer) of SOI substrate
92 Silicon oxide layer of SOI substrate
94 Silicon layer (device layer) of SOI substrate
96 Trench
102 Sacrifice layer
104 Corner portions of MEMS resonators 34 and 36
106 Catalyst
110 Sacrifice layer to form 96
112 CNT
114 CVD silicon oxide film
116 CVD polysilicon

BEST MODE FOR CARRYING OUT THE INVENTION

Referring now to the accompanying drawings, there are shown preferred embodiments of the invention in detail.

The principle of the invention will be discussed before the description of embodiments of the invention.

First, the frequency bandwidth of an MEMS filter is represented by expression (1). In expression (1), $Q_{Filter}$ denotes the Q value of the MEMS filter, BW denotes the frequency bandwidth, $f_o$ denotes the center frequency of the MEMS filter, $C_{ij}$ denotes a normalized coupling coefficient, $k_{rc}$ denotes an effective spring constant of a MEMS resonator joined by CNT, and $k_{cij}$ denotes a spring constant of a coupling element. CNT, etc., that can be manufactured in a bottom up technology is used, whereby the width and the diameter of a coupling element difficult to manufacture in the top down technology in the related art can be formed in nanosize. Further, to join coupling elements in a longitudinal resonant mode (Extensional Mode), the spring constant of the CNT is represented by expression (2). In expression (2), E denotes the Young's modulus of the CNT, A denotes the cross-sectional area, and L denotes the length.

$$Q_{Filter}=f_o/BW=C_{ij}(k_{rc}/k_{cij}) \quad \text{[Expression 1]}$$

$$BW=(f_o/C_{ij})*(k_{cij}/k_{rc})$$

$$k=F/\Delta L=EA/L \quad \text{[Expression 2]}$$

The mass of a coupling element can be calculated from the density of CNT, and it is made possible to decrease the mass several orders of magnitude or more as compared with a usual microsize MEMS resonator (the topic is described later in detail in a first embodiment). According to the invention, the effect of the mass of the coupling element can be ignored, so that the restriction of the length λ/4 is eliminated and the need for limiting placement to the vicinity of the coupling node where the MEMS resonator mass $m_{rc}$ corresponding to the connection part of the MEMS resonator and the coupling element reaching the maximum is eliminated.

Accordingly, the position of each coupling element can be changed and $k_{rc}$ can be made variable in a wide range, so that $k_{rc}/k_{cij}$ shown in expression (1) can be changed as desired and therefore providing flexibility in the design. Since CNT having a mass of several orders of magnitude or more lighter is used, a plurality of CNTs can be joined in parallel for increasing $k_{cij}$ and CNTs shaped like a coil and a waveform thats can also be used for decreasing $k_{cij}$.

First Embodiment

Next, a first embodiment of the invention will be discussed. FIG. 1 is a perspective view to show a MEMS filter unit of the first embodiment of the invention, and the MEMS filter unit is joined according to a first coupling method of MEMS filter. Components identical with those in FIG. 1 are denoted by the same reference numerals in FIGS. 2 and 3 and will not be discussed again.

The MEMS filter unit is characterized by the fact that first and second MEMS resonators 34 and 36 are joined by a first coupling element 38 implemented as a CNT, as shown in FIG. 1. The first and second MEMS resonators 34 and 36 have the same structure and each form a quadrilateral resonating body and are mechanically connected by the first coupling element 38, as shown in FIG. 1. A cylindrical column 42 is connected to the center of each MEMS resonator. It serves as a post for supporting the structure 34 and 36, and is joined to a substrate not shown.

Figure 2:
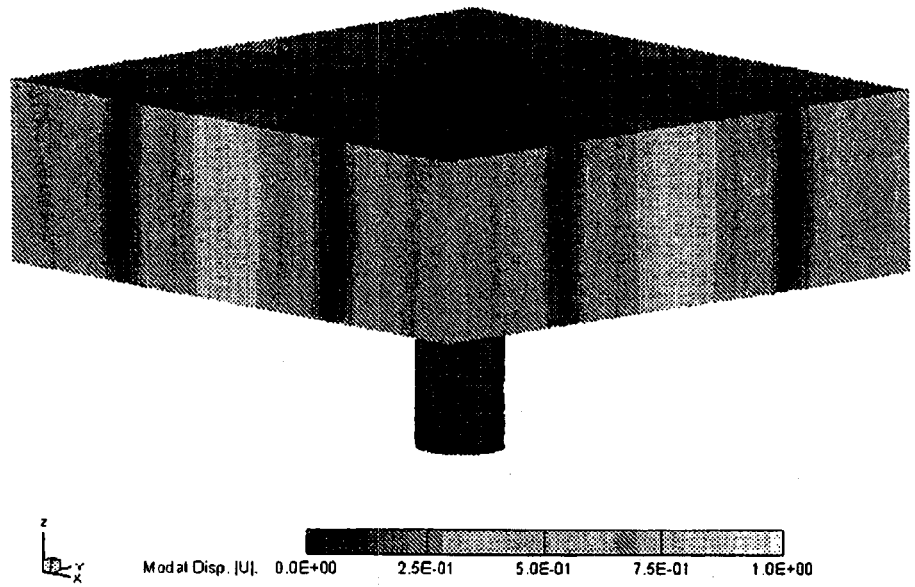
[FIG. 2] A drawing to show the stationary state of an MEMS resonator representing the first embodiment of the invention as finite element analysis.
Figure 3:
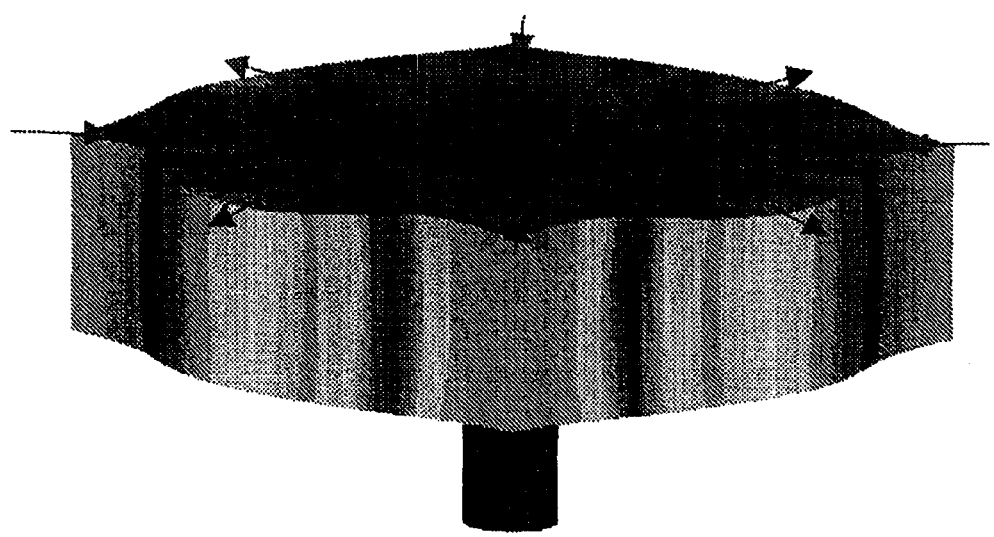
[FIG. 3] A drawing to show the vibration state of the MEMS resonator representing the first embodiment of the invention as finite element analysis.

The dimensions of each of the MEMS resonators 34 and 36 are 7 μm in height, 7 μm in width, and 2 μm in thickness and the diameter and the height of the post 42 are about 1 μm. The MEMS resonator has a resonating frequency of to 1 GHz in a resonant mode of horizontal vibration as a result of calculation using finite element analysis (FEA). FIG. 2 represents the stationary state of the MEMS resonator and FIG. 3 shows the vibration state of the resonator. In the resonant mode, resonance is produced so that the phases of the center of one side and a corner become different 180°, and the corners of each of the MEMS resonators 34 and 36 vibrate horizontally, so that the first coupling element 38 shown in FIG. 1 is joined in longitudinal vibration. The displacement direction of each resonance point is indicated by an arrow.

Figure 4:
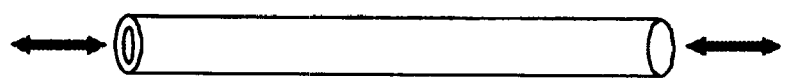
[FIG. 4] A drawing to show the vibration direction and longitudinal resonant mode of a coupling element in the first embodiment of the invention.

The first coupling element 38 is shaped like a hollow fiber as shown in FIG. 4 which is an enlarged view of the main part. Since the MEMS filter unit has the MEMS resonators joined on the left and the right, the coupling element 38 vibrates in the arrow direction. In the MEMS filter unit in FIG. 1, the post 42 is placed in the vicinity of a resonance node of the MEMS resonator 34 and 36, and is positioned at the center of the MEMS resonator.

Next, the operation of the MEMS filter unit is as follows:

First, to operate the MEMS filter unit, a DC bias voltage of Vp is applied through the post 42 and an AC input voltage is applied to a fixed electrode 41 formed with a predetermined spacing from each side of the first MEMS resonator 34, whereby an electrostatic force is generated between the resonating body of the first MEMS resonator 34 and the fixed electrode 41 and the MEMS resonator is vibrated, as shown in FIG. 1.

For the MEMS filter unit, output current is detected from the fixed electrode 41 of the second MEMS resonator 36, whereby finally the output characteristic of the unit is measured. FIG. 1 shows the MEMS filter unit formed only with the first and second MEMS resonators and the first coupling element 38, but an additional MEMS resonator may be joined.

Next, a manufacturing process of the MEMS filter unit will be discussed.

FIGS. 5 to 10 show the manufacturing process represented along the section shown on a dashed line 43 in FIG. 1.

Figure 5:
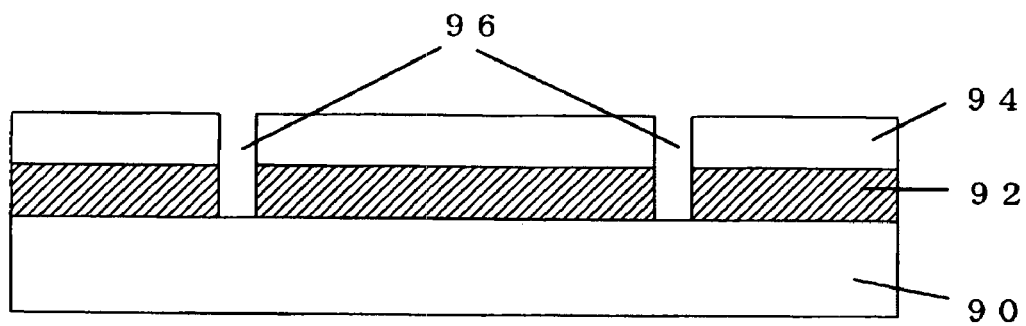
[FIG. 5] A drawing to show a manufacturing process of the MEMS filter unit in the first embodiment of the invention.

First, an anisotropic etching step using reactive ion etching (RIE) through a mask formed by photolithography is performed for an SOI (Silicon-On-Insulator) substrate. A trench 96 is formed through silicon layer 94 having the desired carrier density as a device formation layer and an oxide film 92 on a silicon substrate surface as a base layer 90 (FIG. 5). Since the thickness of the device layer 94 is equal to the height of the first and second MEMS resonators and the thickness of the oxide layer 92 becomes equal to the height of the post 42, the thickness of each layer of the SOI substrate is previously selected. An SOI substrate with the device layer 94 set to 2 μm, the silicon oxide film 92 set to 1 μm, and the silicon layer 90 forming a base layer 90 set to 300 to 500 μm is provided by way of example. For the etching, anisotropic etching using $CF_4$ is used. First, the silicon layer 94 is etched and subsequently, the oxide film 92 is etched.

Figure 6:
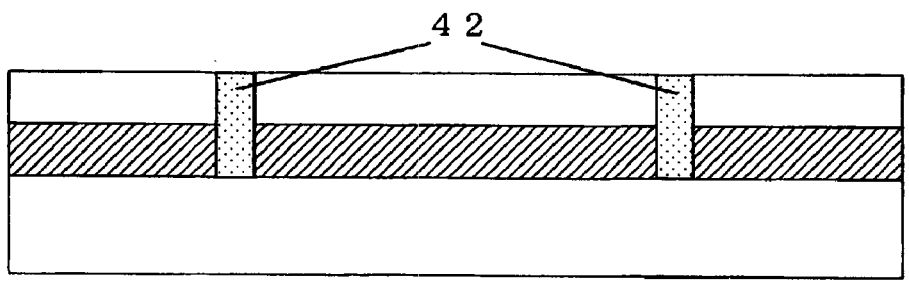
[FIG. 6] A drawing to show the manufacturing process of the MEMS filter unit in the first embodiment of the invention.

Next, each trench 96 is formed with a polysilicon layer which will become a post 42, as shown in FIG. 6. Here, a polysilicon film is formed using LPCVD process and after the film is formed, the polysilicon on the silicon layer 94 is etched back and is removed.

Figure 7:
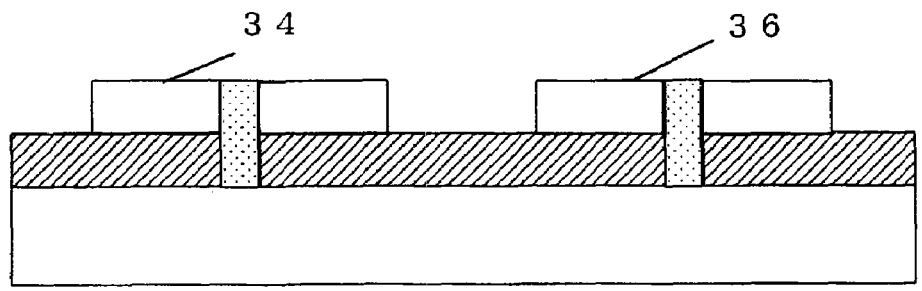
[FIG. 7] A drawing to show the manufacturing process of the MEMS filter unit in the first embodiment of the invention.

As shown in FIG. 7, likewise, a mask pattern is formed by photolithography and then anisotropic etching using RIE is performed to form the resonating bodies of first and second MEMS resonators 34 and 36. Although not represented in the sectional view in the step, the detection electrode 41 in FIG. 1 can also be formed in the same step.

Figure 8:
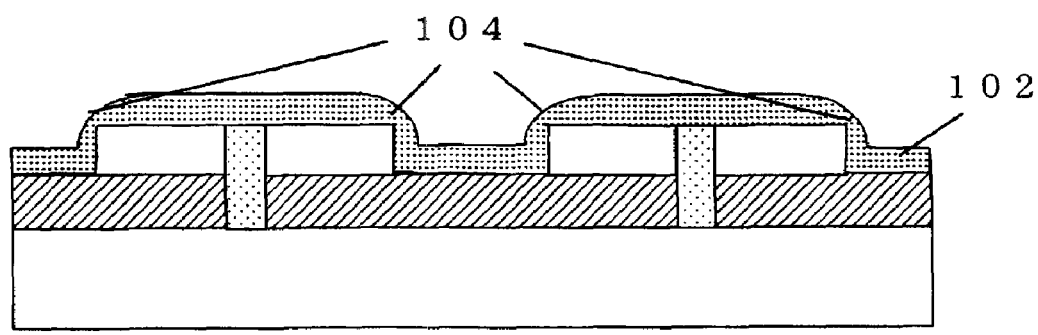
[FIG. 8] A drawing to show the manufacturing process of the MEMS filter unit in the first embodiment of the invention.

Next, a sacrifice layer 102 is formed as shown in FIG. 8. In this case, a resist, etc., for example, is used as the sacrifice layer 102. However, to execute spin coating using a spinner, for example, portions (hereinafter, corners) 104 corresponding to the corners of the MEMS resonators 34 and 36 are required to have resist thickness thinner than any other parts of resist film thickness. For this process, various methods are considered; for example, material with high viscosity of resist can be used, the film thickness can be deposited as thin as possible compared with the height of the MEMS resonators 34 and 36, or the temperature and the time of soft bake and hard bake can be optimized to form resist so as to reflow from the corner of the MEMS resonator.

Figure 9:
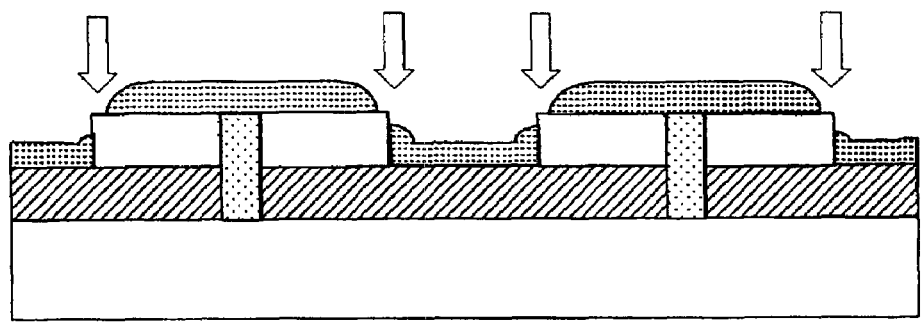
[FIG. 9] A drawing to show the manufacturing process of the MEMS filter unit in the first embodiment of the invention.

As shown in FIG. 9, dry etching is performed using RIE, etc., and the sacrifice layer 102 is thinned to an extent that the corners 104 of the MEMS resonator appear on the surface.

Next, each corner 104 is formed with a catalyst 106 of platinum, etc., with a thickness of about several nm using a vacuum evaporation method. The sacrifice layer 102 and the catalyst 106 of evaporation substance deposited thereon are removed in a ultrasonic bath filled with acetone, etc., (lift off). Last, to release the MEMS resonators 34 and 36 from the substrate, the oxide film 92 is removed in an HF liquid (see FIG. 10).

Thus, catalysts 106 to form CNT are formed in the corners 104 of the resonating bodies of the MEMS resonators 34 and 36, and CNT is grown in the space in a CVD chamber and is then joined together to connect the resonating bodies.

Figure 11:
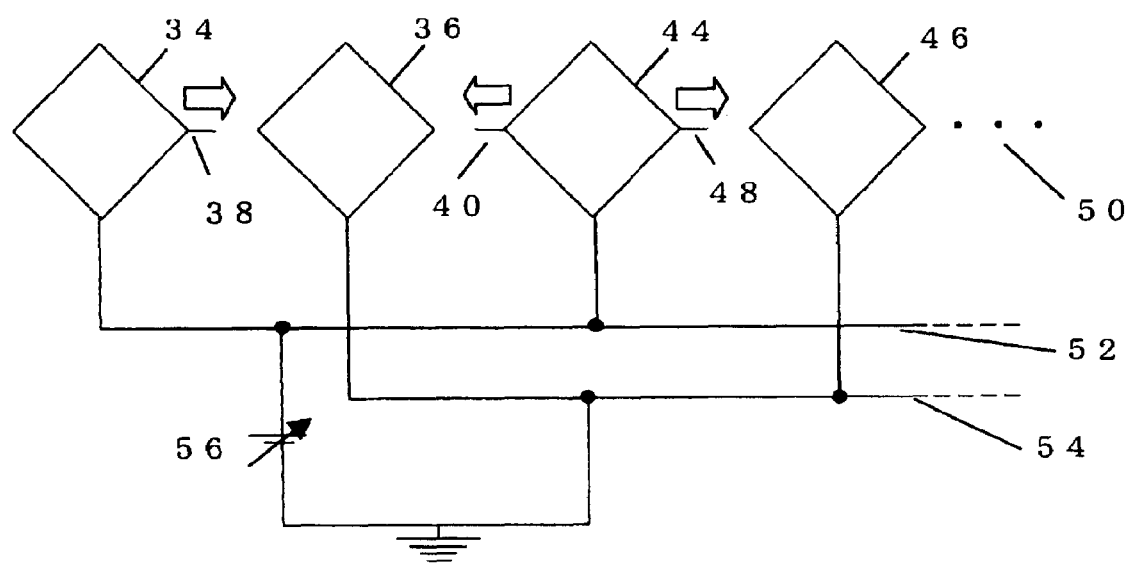
[FIG. 11] A schematic representation to show a forming process of a coupling element in the first embodiment of the invention.

FIG. 11 is a block diagram of a CNT growing unit used for manufacturing the MEMS filter unit in the first embodiment of the invention. In the growing unit used with the first coupling method, shape information of the MEMS resonators which will then become a filter is performed. Then using the manufacturing method of CNT, etc., as the next step, catalyst is placed on two or more MEMS resonators desirable according to the design, and CNT is grown in the space in the CVD chamber where it is then joined together. At this time, a bias DC voltage 56 is applied to first, second, third, and fourth MEMS resonators 34, 36, 44, and 46 so that electric wiring 52 becomes minus potential and electric wiring 54 becomes plus potential, and the first and third MEMS resonators 34 and 44 connected to the electric wiring 52 become minus potential and the second and fourth MEMS resonators 36 and 46 connected to the electric wiring 54 become plus potential.

Accordingly, CNTs 38, 40, and 48 grow from minus to plus electrode. The growing direction is indicated by an arrow in FIG. 11. A dashed line 50 indicates that it is followed by an MEMS resonator and a coupling element like that of the coupling element 40 and the resonating body of the MEMS resonator 36. Using this coupling method, a plurality of CNTs can be grown at the same time, and thus the time and the cost can be saved. The bottom up technology described above makes it possible to manufacture highly accurate nanosize-order coupling elements.

To form the MEMS filter unit of the first embodiment, the coupling elements implemented as CNT may be cut as needed, and a large number of MEMS filter units can be formed simultaneously.

Also with this approach a MEMS filter unit provided by coupling three or more MEMS filters are easily realized.

Figure 12:
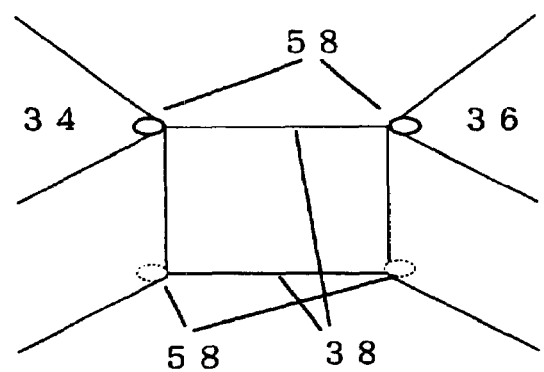
[FIG. 12] A perspective view of a structure wherein a coupling element 38 in the first embodiment of the invention is grown in top and bottom corners.
Figure 13:
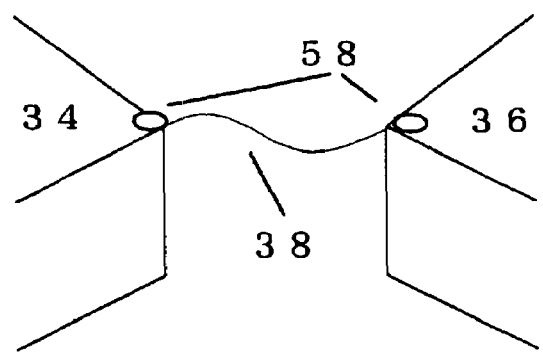
[FIG. 13] A drawing to show a structure wherein a coupling element 38 in the first embodiment of the invention is provided with a waveform.
Figure 14:
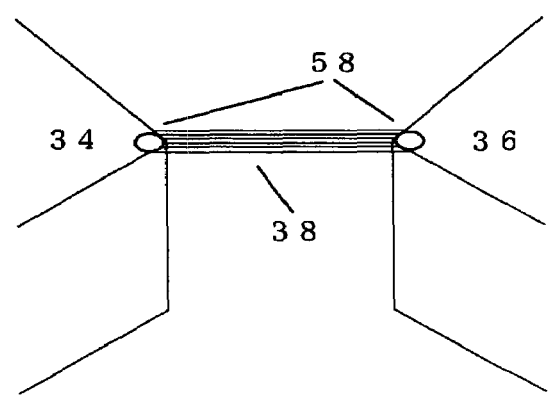
[FIG. 14] A drawing to show a structure wherein a plurality of coupling elements 38 in the first embodiment of the invention are arranged in parallel.

FIGS. 12, 13, and 14 show modified examples of the first embodiment of the invention. In the examples, drawings to show the coupling element vicinity on enlarged scale in FIGS. 12, 13, and 14 are shown. Each drawing shows a deformed structure of the coupling element 38, whereby it is made possible to change the spring constant $k_{cij}$ in expression (1). The dimensions of the coupling element 38 in FIGS. 12, 13, and 14 change depending on design and also change depending on whether CNT is a single-layer CNT (SWCNT) or a multilayer CNT (MWCNT); it can be grown with about 1 nm to 50 nm in diameter and about 1 μm to 5 μm in length. In FIG. 12, coupling element CNTs 38 are joined between top and bottom corners and catalysts 58 is deposited on both side corners.

In the structure wherein the coupling elements 38 are placed on the top and the bottom as in FIG. 12, it is made possible to increase $k_{cij}$ of the coupling element. Each circle indicated by a dashed line in FIG. 12 indicates that the catalysts 58 is deposited on the lower face.

FIG. 13 shows a structure wherein the length of the coupling element 38 is extended to form a shape as hanging down like a waveform. Originally, it is known that CNT is grown by a chemical reaction between molten catalyst particles and carbonaceous gas particles. The place where chemical reaction is caused to occur varies depending on the type of material used as the catalyst 58; for example, if iron (Fe) is used as the catalyst 58, the place where chemical reaction is suppose to occur first appears on the interface between the minus electrode and CNT, and consequently the growth continues after the CNT reaches plus electrode, the result which will form a shape of waveform in CNT. The coupling element 38 is provided with a waveform as in FIG. 13, whereby it is possible to decrease $k_{cij}$ and flexibility of design of $k_{rc}/k_{cij}$ represented in expression (1).

FIG. 14 shows a structure wherein a plurality of coupling elements 38 are arranged in parallel. In the structure, large catalysts 58 in FIGS. 12 and 13 are deposited, whereby a plurality of coupling elements 38 are grown and consequently the structure in FIG. 14 is made possible. In FIG. 8, it is made possible to increase $k_{cij}$. Therefore, in the structures in FIGS. 12, 13, and 14, $k_{cij}$ of the coupling element can be changed.

The dimensions of the CNTs in FIGS. 12 to 14 are determined by design $k_{cij}$. For example, to use $k_{cij}$=113 N/m in non-patent document 1, the length L of the CNT is calculated as 1 μm, the diameter is calculated as 12 nm; if L is calculated as 3 μm, the diameter is calculated as 20 nm. Here, the Young's modulus of the CNT is E=1E12 Pa. The CNT mass is indicated by M=ρ×V where M denotes the mass, ρ denotes the density, and V denotes the volume. Considering the CNT as a cylinder, to use ρ=1400 kg/m$^3$, when L is 1 μm, M=1.131E-22 kg can be calculated; when L is 3 μm, M=1.319E-18 kg can be calculated.

In contrast, the mass of the polycrystalline silicon coupling beam in non-patent document 1 described in the related art example becomes M=6.670E-14 kg if it is calculated using a similar method. Making a comparison therebetween, it becomes obvious that use of CNT as a coupling element help to decrease the mass by about four orders of magnitude or more.

In FIGS. 12 to 14, the position of CNT is placed in a corner of the quadrilateral shape of the MEMS resonator, but the place is not limited and it may be made equal to the design value $k_{rc}$ in expression (1).

Figure 15:
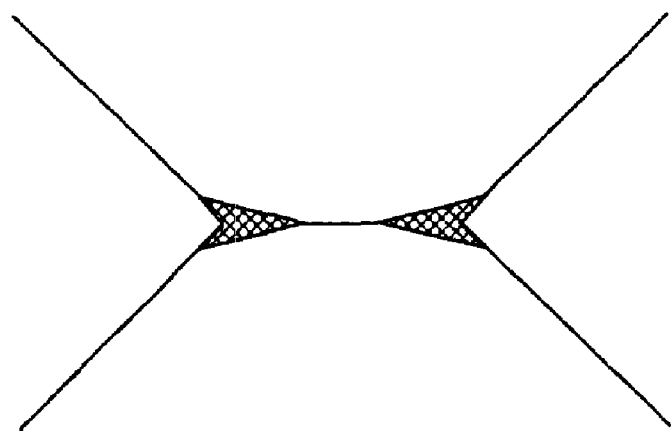
[FIG. 15] A drawing to show a modified example of a coupling element part (formed with a triangular claw in a corner of an MEMS resonator) of a coupling element 38 in the first embodiment of the invention.
Figure 16:
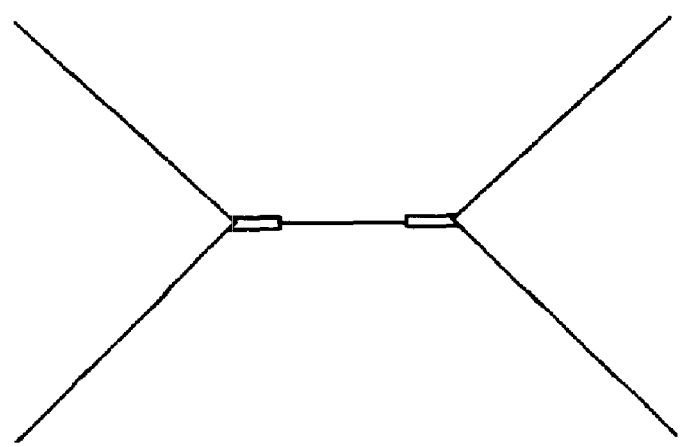
[FIG. 16] A drawing to show a modified example of a coupling element part (formed with a cantilever in a corner of an MEMS resonator) of a coupling element 38 in the first embodiment of the invention.

The position where CNT can easily be grown is selected to provide a strong coupling element. For example, a structure wherein a corner of the quadrilateral shape of the MEMS resonator is to be made a triangular claw as shown in FIG. 15 or a structure wherein a cantilever is formed in a corner of the quadrilateral shape of the MEMS resonator as shown in FIG. 16 is adopted, so that the growth of a single CNT in a desirable position is accomplished.

As a triangular claw is adopted, stronger connection is made possible if the coupling element part area is small. Also, as a cantilever is formed, more reliable vibration can be realized.

The design value $k_{rc}$ in expression (1) also changes depending on the MEMS resonator. For example, the spring constant is low and is represented as $k_{rc}$=1362 N/m in the vicinity of large amplitude in the MEMS resonator in non-patent document 1, and the spring constant is represented as $k_{rc}$=96061 N/m in the vicinity of a coupling node with high spring constant. If desired $k_{rc}/k_{cij}$ is required on design, even if the actual CNT spring constant $k_{cij}$ differs from that in calculation expression (2), $k_{rc}$ can be changed in a wide range with 94000 N/m or more, so that $k_{rc}/k_{cij}$ can be set to any desired value on design.

In the first embodiment, the two quadrilateral MEMS resonators 34 and 36 are joined, but the MEMS filter unit may be used with the four MEMS resonators 34, 36, 44, and 46 coupled as shown in FIG. 11; the structure is not limited and a structure wherein the coupling element 38 is easily grown may be used.

Second Embodiment

Next, a second embodiment of the invention will be discussed.

The post 42 in the first embodiment of the invention is made of polysilicon; in the second embodiment, an example wherein the portion corresponding to the post 42 is formed of CNT 12 will be discussed.

The embodiment is characterized by a hole previously formed in the portion corresponding to a node of a resonating body and CNT grown in the hole by self-assembly; and a connection part of the resonating body is filled with polysilicon, etc., to provide strong connection.

Figure 17:
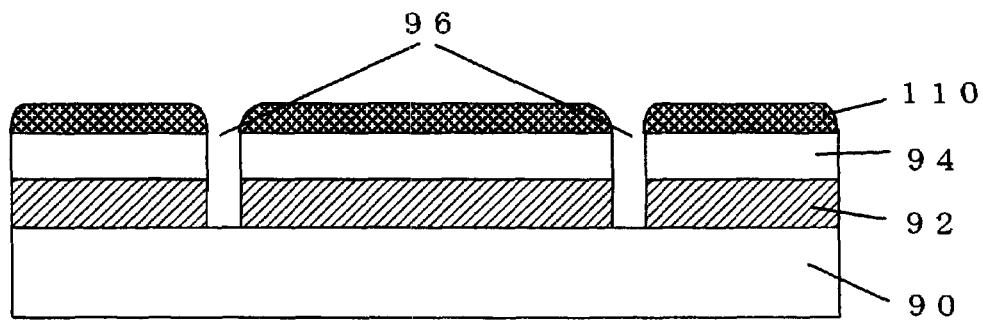
[FIG. 17] A drawing to show a manufacturing process of an MEMS filter unit in a second embodiment of the invention.

FIGS. 17 to 22 show the manufacturing process represented as the section corresponding to the section taken on the dashed line 43 in FIG. 1. FIG. 17 shows a state before removal of the sacrifice layer 110 using photoresist as a mask to form trenches 96, which is equivalent to step in FIG. 5.

Figure 18:
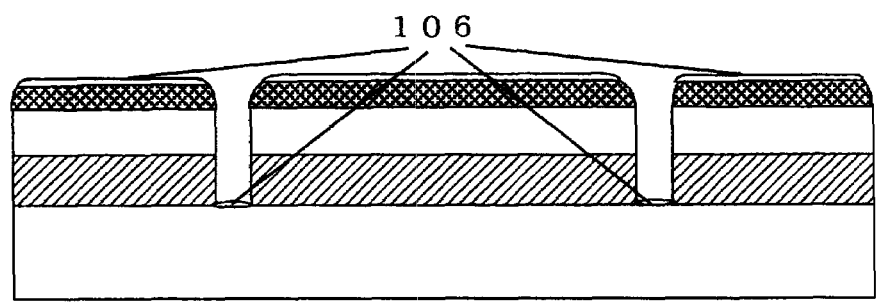
[FIG. 18] A drawing to show the manufacturing process of the MEMS filter unit in the second embodiment of the invention.

Catalysts 106 are formed according to a vacuum evaporation method (FIG. 18). In the example, an evaporator is used to avoid deposition on sides of trenches 96.

Figure 19:
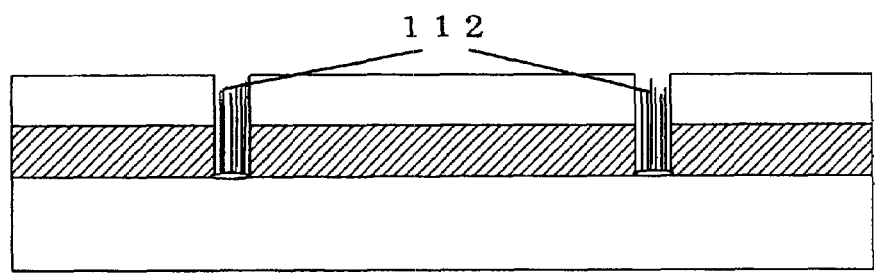
[FIG. 19] A drawing to show the manufacturing process of the MEMS filter unit in the second embodiment of the invention.

As shown in FIG. 19, after a step of removing sacrifice layers 110 by lift off, CNTs 112 are grown in the catalysts 106 left in the bottoms of the trenches 96.

Figure 20:
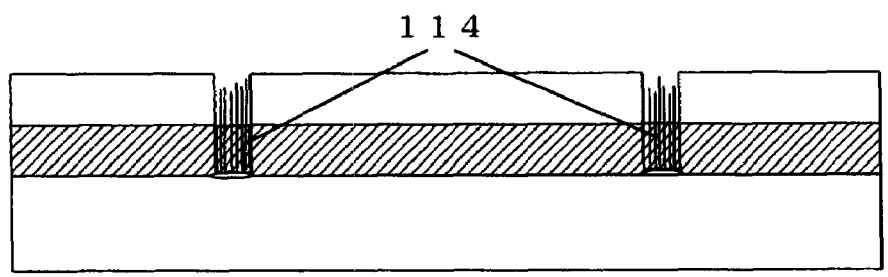
[FIG. 20] A drawing to show the manufacturing process of the MEMS filter unit in the second embodiment of the invention.

In FIG. 20, after the CNTs 112 are grown, the trenches 96 are filled with silicon oxide films 114 according to an LPCVD method. Here, the silicon oxide films 114 are formed to the height of a post 42. Although the LPCVD method may be used, when the LPCVD method is used, the silicon oxide films left on the tops of silicon layers 94 need to be removed by CMP. Using a different method, a sacrifice layer may be previously formed, then a silicon oxide film may be formed on top according to a sputter method. After the film is formed, a lift off step of removing the sacrifice layer and the silicon oxide film on the sacrifice layer may be executed so as to prevent an oxide film from being deposited in any unnecessary place.

Here, the silicon oxide film is used, but the material is not limited and any film material may be adopted if it can be removed in the later step; for example, a method of evaporating metal according to the vacuum evaporation method and removing a sacrifice layer by lift off to prevent metal from being deposited in any unnecessary place may be adopted.

Figure 21:
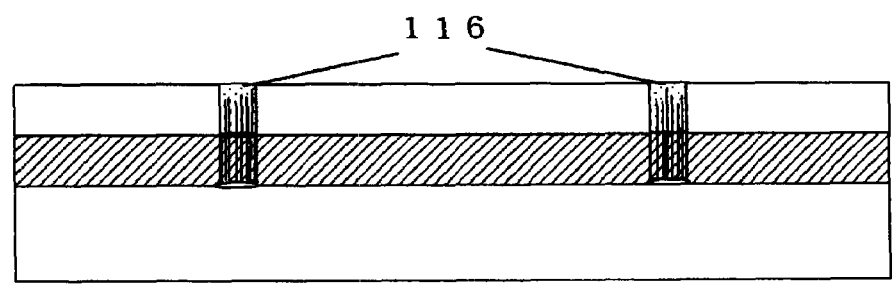
[FIG. 21] A drawing to show the manufacturing process of the MEMS filter unit in the second embodiment of the invention.

Next, as shown in FIG. 21, the trenches 96 which will become portions of MEMS resonators are filled with polysilicon, etc., according to the LPCVD method and polysilicon left on the tops of the silicon layers 94 forming device layers is removed by CMP, etc.

Figure 10:
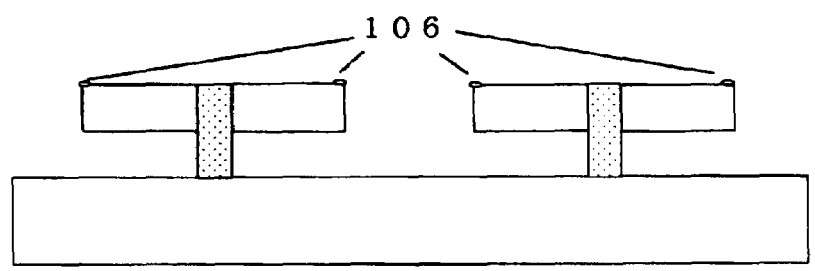
[FIG. 10] A drawing to show the manufacturing process of the MEMS filter unit in the first embodiment of the invention.
Figure 22:
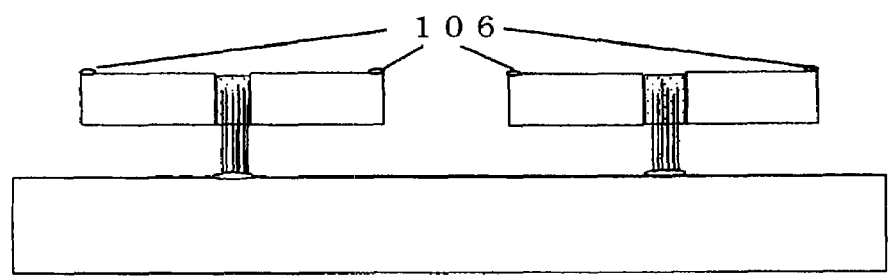
[FIG. 22] A drawing to show the manufacturing process of the MEMS filter unit in the second embodiment of the invention.

Last, FIG. 22 shows a step similar to that shown in FIG. 10, and manufacturing steps in FIGS. 20 to 22 for patterning resonating bodies, forming catalysts, removing silicon oxide films 92, and forming resonating bodies are executed for forming each resonating body using CNT as a post.

According to the structure, CNT formation and MEMS step are processed simultaneously, whereby manufacturing is facilitated and coupling of the resonating body and the coupling element can be strengthened and alignment is also extremely easy.

Third Embodiment

Figure 23:
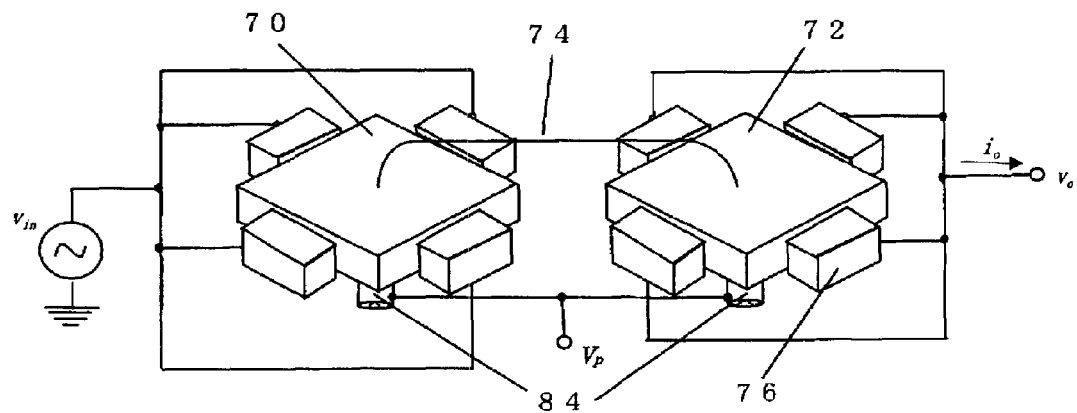
[FIG. 23] A drawing to show an MEMS filter unit in a third embodiment of the invention.

FIG. 23 shows a second coupling method of MEMS filter in a third embodiment of the invention. Components identical with those in FIG. 23 are denoted by the same reference numerals in FIGS. 24, 25, and 26 and will not be discussed again.

The embodiment is characterized by the fact that center parts corresponding to coupling nodes of first and second MEMS resonators 70 and 72 each having a quadrilateral shape are connected mechanically by a first coupling element 74 implemented as CNT, as shown in FIG. 23. Others are similar to those of the first embodiment shown in FIG. 1 and a fixed electrode 76 of each MEMS resonator is shown.

As a manufacturing method, a method corresponding to the second coupling method described above is adopted for forming resonating bodies of the first and second MEMS resonators 70 and 72 and then joining them by the coupling element 74.

It is assumed that the MEMS resonator resonant mode in the first embodiment is used as a resonant mode. In the resonant mode, the center of a quadrilateral shape is adopted as a coupling node. Thus, as the optimum structure, a post 84 is supported from the lower face center of the MEMS resonator 70, 72 as shown in FIG. 23. In addition, the MEMS resonators 70 and 72 are joined in the vicinity of the coupling node using the coupling 74 to increase the spring constant $k_{rc}$ of the MEMS resonator corresponding to the connection part of the MEMS resonator and the coupling element shown from expression (1).

Figure 24:
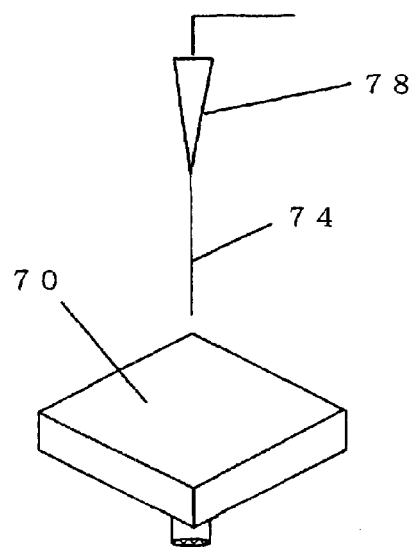
[FIG. 24] A drawing of a step of moving a coupling element 74 using an AFM in the third embodiment of the invention.
Figure 25:
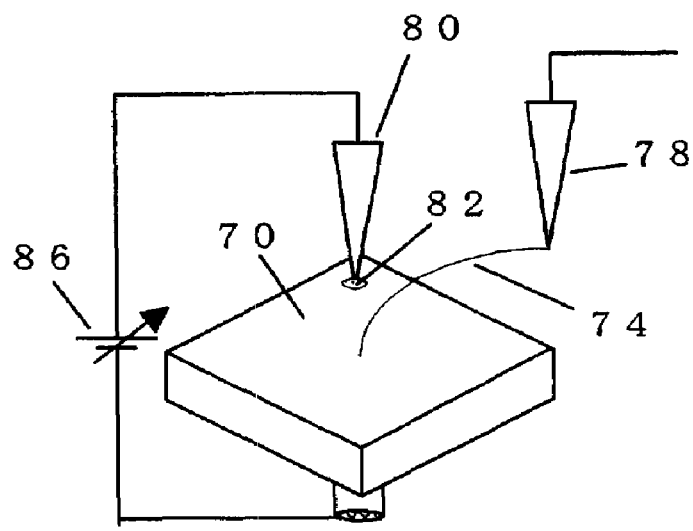
[FIG. 25] A drawing of a connection step of attaching the coupling element 74 with an electric conductor particle 82 using an STM in the third embodiment of the invention.
Figure 26:
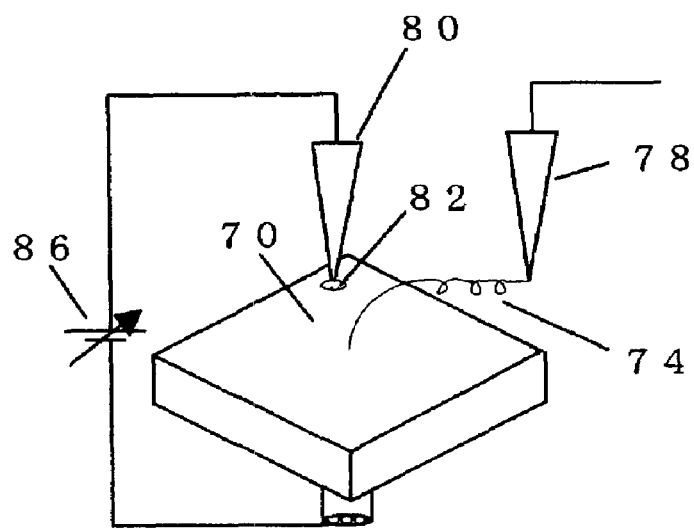
[FIG. 26] A modified drawing wherein the coupling element 74 in the third embodiment of the invention has a coil.

In FIGS. 24, 25, 26, and 27, the second coupling method is used; to simplify the structure, the drawings of FIGS. 24, 25, and 26 describe only the MEMS resonator 70 and the first coupling element 74 represented in the third embodiment in FIG. 23.

In the second coupling method, a method of separately manufacturing a coupling element and the MEMS resonator, and connecting the coupling element and the MEMS resonator in the last step is used. In this case, a method of moving a nanosize coupling element 74 becomes necessary at first. Then, in FIG. 24, a van der Waals force is exerted between the coupling element 74 and an AFM probe 78 with an atomic force microscope (AFM), etc., and the attracted coupling element 74 is moved to the center point of the quadrilateral shape. In FIG. 25, the coupling element 74 is brought close further to the MEMS resonator 70 and is brought into contact to the desired center location. In this case, the connection part is provided with an electric conductor particle 82 with a scanning tunneling microscope (STM) 80, etc. A DC voltage is applied to the STM probe 80 as a pulse voltage, whereby the electric conductor particle 82 is evaporated in the end part of the probe 80 by an electrostatic force working in the electric field and is moved to the connection part.

Figure 27:
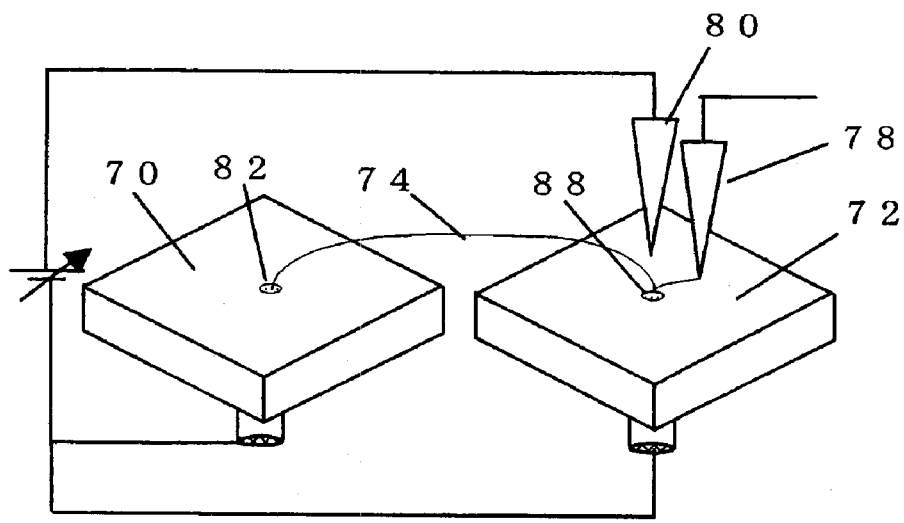
[FIG. 27] A drawing of a step of connecting the coupling element 74 in the third embodiment of the invention to a second MEMS resonator 72.
Figure 28:
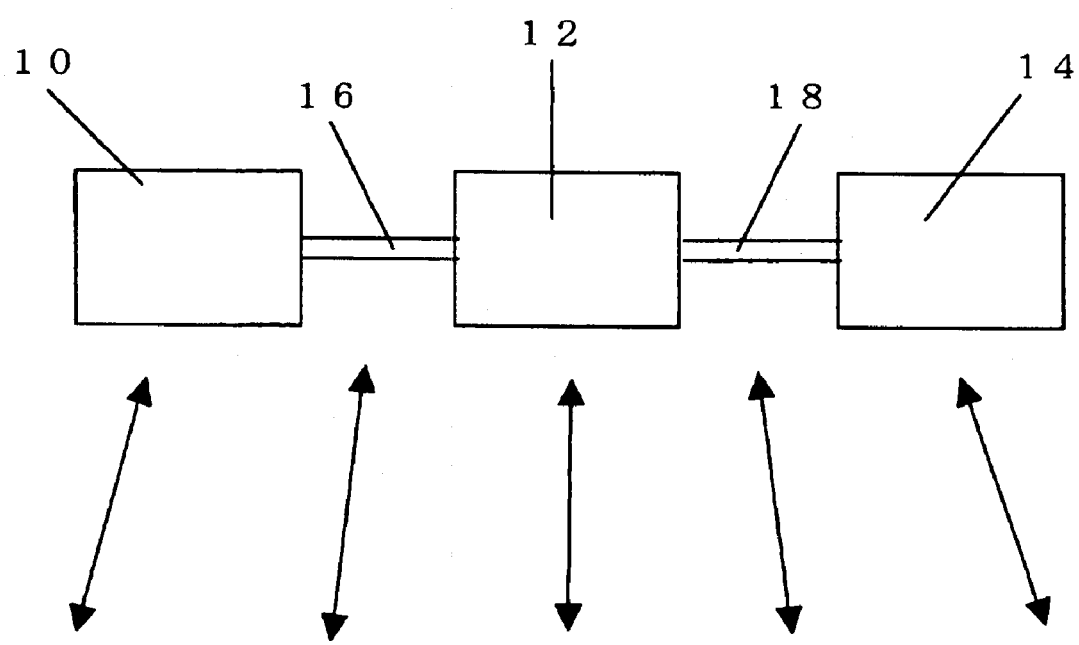
[FIG. 28] A block diagram of joining three MEMS resonators mechanically in a related art example.
Figure 29:
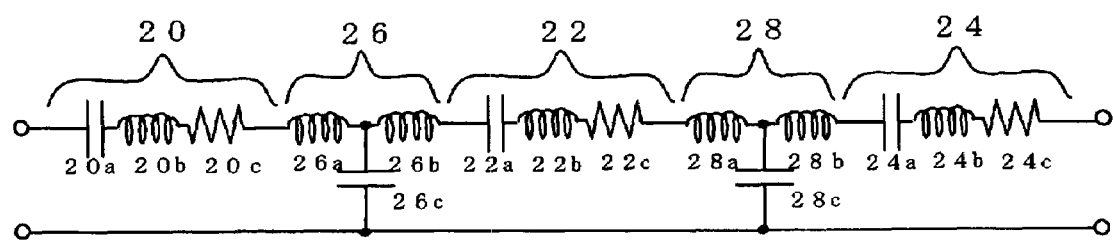
[FIG. 29] An electric equivalent circuit diagram to FIG. 28.
Figure 30:
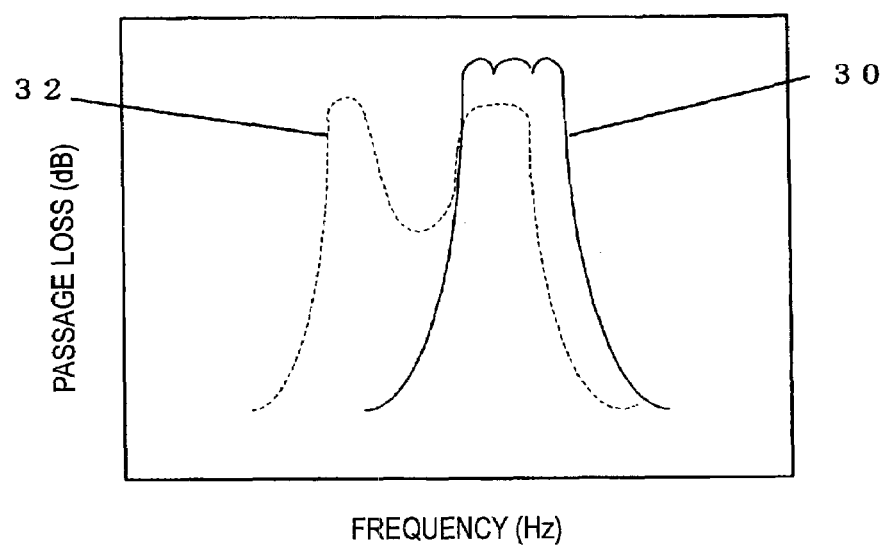
[FIG. 30] A passband waveform chart of the three-stage MEMS filter in FIG. 28.

It is made possible to place the electric conductor particle 82 evaporated in the STM probe 80 in the connection part of the first MEMS resonator 70 and the first coupling element 74 by applying a DC pulse voltage 86 in a similar manner. FIG. 27 is a continuation of FIG. 25 and shows a step of connecting the first coupling element 74 to the second MEMS resonator 72. Here, the state in which the AFM probe 78 and the coupling element 74 are in contact with each other in FIG. 24 is kept, and a movement is made to the center of the quadrilateral shape of the second MEMS resonator 72. Similar method of moving the electric conductor particle 82 in FIG. 25 is used to place an electric conductor particle 88 in the connection part of the second MEMS resonator 72 and the first coupling element. According to the step, the first and second MEMS resonators 70 and 72 are connected by the first coupling element 74. FIG. 26 is a modified drawing of FIG. 25, wherein while the AFM probe 78 is moved, the first coupling element 74 is formed like a coil. According to this structure, it is made possible to decrease $k_{cij}$ in expression (1).

In the first to third embodiments, the coupling element for coupling the MEMS resonators is implemented as CNT. But for example, it may be any other nanowire that can be manufactured according to a bottom up technology. As the type of CNT, for example, a single-layer CNT (SWCNT) or a multi-layer CNT (MWCNT) may be used.

The invention is not limited to the specific embodiments described above and appropriate modifications can be made.

Industrial Applicability

The MEMS filter according to the invention provides the MEMS filter characteristic with no mass loading effects by using nanosize CNT, etc., as a mechanical coupling element of MEMS resonators that can be manufactured easily and moreover at a lower cost to realizes a small-size, high-performance mobile terminal unit having flexibility in design.

The invention claimed is:

1. An MEMS filter unit comprising:
a plurality of electromechanical resonators each having a resonating body formed so as to be able to mechanically vibrate; and
one or more electrodes disposed with a predetermined spacing from the resonating body for making possible electromechanical conversion,
wherein the electromechanical resonators are jointed through a coupling element, and
wherein the coupling element is a nanosize striped body.

2. The MEMS filter unit according to claim 1,
wherein the coupling element is a carbon nanotube (CNT).

3. The MEMS filter unit according to claim 1,
wherein the coupling element is a nanowire.

4. The MEMS filter unit according to claim 1,
wherein the resonating body forms a quadrilateral MEMS resonator having at least one coupling node and comprises at least one support mechanism so that the resonating body is supported on a substrate.

5. The MEMS filter unit according to claim 4,
wherein the support mechanism comprises one or more carbon nanotubes.

6. The MEMS filter unit according to claim 4,
wherein the coupling element is joined at the coupling node of the resonating body.

7. The MEMS filter unit according to claim 1,
wherein the coupling element comprises a plurality of lines.

8. The MEMS filter unit according to claim 1,
wherein the coupling element is formed so as to connect a plurality of parts of the resonating body.

9. The MEMS filter unit according to claim 1,
wherein the coupling element is a coil-shaped body.

* * * * *